(12) United States Patent
Zhang et al.

(10) Patent No.: US 9,608,011 B2
(45) Date of Patent: Mar. 28, 2017

(54) THIN-FILM TRANSISTOR AND FABRICATING METHOD THEREOF, ARRAY SUBSTRATE AND DISPLAY APPARATUS

(71) Applicants: Boe Technology Group Co., Ltd., Beijing (CN); Beijing Boe Optoelectronics Technology Co., Ltd., Beijing (CN)

(72) Inventors: Ying Zhang, Beijing (CN); Xin Li, Beijing (CN); Hong Zhu, Beijing (CN); Hongjun Yu, Beijing (CN)

(73) Assignees: Boe Technology Group Co., Ltd., Beijing (CN); Beijing Boe Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/778,939

(22) PCT Filed: Mar. 16, 2015

(86) PCT No.: PCT/CN2015/074270
§ 371 (c)(1),
(2) Date: Sep. 21, 2015

(87) PCT Pub. No.: WO2016/058321
PCT Pub. Date: Apr. 21, 2016

(65) Prior Publication Data
US 2016/0307919 A1    Oct. 20, 2016

(30) Foreign Application Priority Data

Oct. 13, 2014 (CN) .......................... 2014 1 0539188

(51) Int. Cl.
H01L 27/00 (2006.01)
H01L 29/00 (2006.01)
(Continued)

(52) U.S. Cl.
CPC ............ *H01L 27/124* (2013.01); *H01L 27/12* (2013.01); *H01L 29/06* (2013.01); *H01L 29/458* (2013.01);
(Continued)

(58) Field of Classification Search
CPC ............... H01L 27/124; H01L 27/3262; H01L 27/78678; H01L 29/458; H01L 29/78663; H01L 29/78696
See application file for complete search history.

(56) References Cited

U.S. PATENT DOCUMENTS 6,281,552 B1 * 8/2001 Kawasaki ........... H01L 27/1214
257/344
6,833,883 B2 * 12/2004 Park .................. G02F 1/136227
257/59
(Continued)

FOREIGN PATENT DOCUMENTS

| CN | 101673770 | 3/2010 |
| CN | 102184968 | 9/2011 |

(Continued)

OTHER PUBLICATIONS

International Search Report and Written Opinion from PCT/CN15/074270 dated Jul. 9, 2015.
(Continued)

*Primary Examiner* — Nikolay Yushin
(74) *Attorney, Agent, or Firm* — Calfee, Halter & Griswold LLP

(57) ABSTRACT

The present invention discloses a thin-film transistor and a fabricating method thereof, an array substrate and a display apparatus. An active layer in the thin-film transistor comprises a first active layer and a second active layer which are stacked; wherein, an orthographic projection of the first active layer on the substrate covers orthographic projections
(Continued)

of the source electrode, the drain electrode as well as a gap located between the source electrode and the drain electrode on the substrate, and covers an orthographic projection of the gate electrode on the substrate; the second active layer is located at the gap between the source electrode and the drain electrode, and an orthographic projection of the second active layer on the substrate is located in a region where the orthographic projection of the gate electrode on the substrate is located.

12 Claims, 1 Drawing Sheet

(51) Int. Cl.
  *H01L 27/12* (2006.01)
  *H01L 29/786* (2006.01)
  *H01L 29/06* (2006.01)
  *H01L 29/45* (2006.01)

(52) U.S. Cl.
  CPC ...... *H01L 29/786* (2013.01); *H01L 29/78663* (2013.01)

(56) References Cited

U.S. PATENT DOCUMENTS

| | | | |
|---|---|---|---|
| 8,344,380 B2* | 1/2013 | Godo | ............ H01L 27/12 257/347 |
| 2010/0148178 A1* | 6/2010 | Godo | ............ H01L 27/12 257/59 |
| 2010/0314618 A1 | 12/2010 | Tanaka et al. | |

FOREIGN PATENT DOCUMENTS

| | | |
|---|---|---|
| CN | 102280489 | 12/2011 |
| CN | 102347368 | 2/2012 |
| CN | 103500764 | 1/2014 |
| CN | 104362179 | 2/2015 |
| KR | 1020060021188 | 3/2006 |

OTHER PUBLICATIONS

Office Action from China Application No. 201410539188.7 dated Oct. 25, 2016.

* cited by examiner

THIN-FILM TRANSISTOR AND FABRICATING METHOD THEREOF, ARRAY SUBSTRATE AND DISPLAY APPARATUS

REFERENCE TO RELATED APPLICATIONS

This application is the U.S. national phase of International Application No. PCT/CN15/74270, filed on Mar. 15, 2015, which claims the priority to Chinese Patent Application No. 201410539188.7 filed on Oct. 13, 2014, the entire disclosures of which are incorporated by reference in their entirety.

TECHNICAL FIELD

The present invention relates to the field of display, and particularly relates to a thin-film transistor and a fabricating method thereof, an array substrate and a display apparatus.

BACKGROUND ART

Generally, in the production of a display device, a thin-film transistor (TFT) plays a very important role. A pixel capacitor of the display device is rapidly charged by using an on-state of the thin-film transistor, and a voltage of the pixel capacitor is sustained by using an off-state of the thin-film transistor, so that unification of rapid response and good storage is realized. The thin-film transistor as a non-linear switch is widely applied to fields such as a large-area liquid-crystal display and a contact type image sensor, due to a very high on-state current (Ion) to off-state current (Ioff) ratio and a steep transfer characteristic.

At present, a specific structure of a conventional bottom-gate unstack type amorphous silicon thin-film transistor is shown in FIG. 1, which comprises a substrate 01, a gate electrode 02 disposed on the substrate 01, an active layer 03 disposed on the gate electrode 02 and insulated from the gate electrode 02, as well as a source electrode 04 and a drain electrode 05 which are oppositely arranged and electrically connected with the active layer 03 respectively. When a current is applied to the gate electrode 02 by a circuit mounted in the substrate 01, a current loaded to the source electrode 04 is transmitted to the drain electrode 05 through the active layer 03, thereby driving a pixel unit of the display device to display an image. A gate insulating layer 06 is disposed between the gate electrode 02 and the active layer 03, and a passivation layer 07 is disposed over the source electrode 04 and the drain electrode 05. The gate insulating layer 06 is generally made of an a-SiNx thin film, the active layer 03 is generally made of an a-Si:H thin film, the passivation layer 07 is generally made of an a-SiNx thin film, and the gate electrode 02, the source electrode 04 and the drain electrode 05 are generally made of a metal chromium material. In order to improve contact characteristics between the source electrode 04 and the a-Si:H thin film as well as between the drain electrode 05 and the a-Si:H thin film, thin n+ type a-Si:H thin films are inserted therebetween to serve as ohmic contact layers 08.

The a-Si:H thin film serving as the active layer of the thin-film transistor is a material with a good light sensitive characteristic. However, under a backlight illumination condition, a resistance value of the active layer per se may change, so that the off-state current of the thin-film transistor is increased by 2-3 orders of magnitudes. In this way, the on-state current to off-state current ratio of the thin-film transistor is greatly reduced, and the image display quality of a liquid-crystal display is seriously affected.

Consequently, a technical problem to be solved by those skilled in the art is how to increase the on-state current to off-state current ratio of the thin-film transistor under the backlight illumination condition.

SUMMARY OF THE INVENTION

In view of this, embodiments of the present invention provide a thin-film transistor and a fabricating method thereof, an array substrate and a display apparatus, which may effectively inhibit the increase of an off-state current and increase an on-state current to off-state current ratio, thereby improving a luminescence property of the thin-film transistor.

Consequently, an embodiment of the present invention provides a thin-film transistor, which comprises a substrate, a gate electrode disposed on the substrate, an active layer disposed on the gate electrode and insulated from the gate electrode, as well as a source electrode and a drain electrode which are oppositely arranged and electrically connected with the active layer respectively. The active layer comprises a first active layer and a second active layer which are stacked. An orthographic projection of the first active layer on the substrate covers orthographic projections of the source electrode, the drain electrode, as well as a gap located between the source electrode and the drain electrode on the substrate, and covers an orthographic projection of the gate electrode on the substrate.

The second active layer is located at the gap between the source electrode and the drain electrode, and an orthographic projection of the second active layer on the substrate is located in a region where the orthographic projection of the gate electrode on the substrate is located.

In one possible implementation, in the above thin-film transistor provided by the embodiment of the present invention, the second active layer is located above the first active layer and mutually connected with the first active layer. In particular, the second active layer is electrically connected with the first active layer; or, the second active layer is mutually insulated from the first active layer, and electrically connected with the source electrode and the drain electrode individually.

In one possible implementation, the above thin-film transistor provided by the embodiment of the present invention further comprises ohmic contact layers which are disposed between the first active layer and the source electrode as well as between the first active layer and the drain electrode.

In one possible implementation, the above thin-film transistor provided by the embodiment of the present invention further comprises a light-shielding layer disposed above the second active layer and mutually insulated from the second active layer. An orthographic projection of the light-shielding layer on the substrate covers the orthographic projection of the second active layer on the substrate.

In one possible implementation, in the above thin-film transistor provided by the embodiment of the present invention, a thickness of the second active layer is greater than that of the first active layer.

In one possible implementation, in the above thin-film transistor provided by the embodiment of the present invention, a thickness of the first active layer is 60 nm-100 nm.

In one possible implementation, in the above thin-film transistor provided by the embodiment of the present invention, the sum of thicknesses of the first active layer and the second active layer is 100 nm-500 nm.

An embodiment of the present invention provides an array substrate, comprising the above thin-film transistor provided by the embodiment of the present invention.

An embodiment of the present invention provides a display apparatus, comprising the above array substrate provided by the embodiment of the present invention.

An embodiment of the present invention further provides a fabricating method of the above thin-film transistor provided by the embodiment of the present invention, comprising: forming a pattern of a gate electrode on a substrate; forming a pattern of a first active layer on the substrate formed with the gate electrode; and forming patterns of a second active layer, a source electrode and a drain electrode on the first active layer.

The embodiments of the present invention have advantageous effects, including:

the embodiments of the present invention provide a thin-film transistor and a fabricating method thereof, an array substrate and a display apparatus. The active layer in the thin-film transistor comprises the first active layer and the second active layer which are stacked, wherein the orthographic projection of the first active layer on the substrate covers the orthographic projections of the source electrode, the drain electrode as well as the gap located between the source electrode and the drain electrode on the substrate, and covers the orthographic projection of the gate electrode on the substrate; the second active layer is located at the gap between the source electrode and the drain electrode, and the orthographic projection of the second active layer on the substrate is located in the region where the orthographic projection of the gate electrode on the substrate is located. Under a backlight illumination condition, because the region where the second active layer of the thin-film transistor is located is shielded by the gate electrode, only a region, which is not shielded by the gate electrode, in the first active layer may generate photo-induced carriers. Consequently, there are less photo-induced carriers generated by such a structure, the increase of the off-state current is effectively inhibited, and thus the on-state current to off-state current ratio is increased, leading to an improved luminescence property of the thin-film transistor, and an enhanced image display quality of a display device.

As used herein, an expression "orthographic projection" means that a projection direction is perpendicular to a projection plane. As such, an expression "orthographic projection of A on B" means that A is projected on B in a direction perpendicular to B.

DETAILED DESCRIPTION OF THE INVENTION

The detail description of a thin-film transistor and a fabricating method thereof, an array substrate and a display apparatus provided by embodiments of the present invention will be described in detail hereinafter in conjunction with the accompanying drawings.

A thickness of each film layer and a size and a shape of a region in the accompanying drawings do not indicate an actual ratio of each component of the thin-film transistor. An objective of the accompanying drawings is only to illustrate the present invention.

Figure 1:
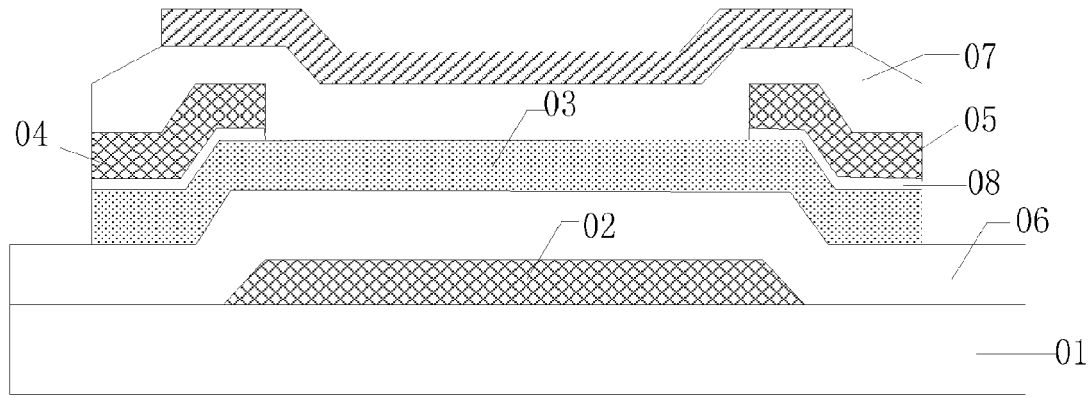
FIG. 1 is a schematic structural view of a bottom-gate unstack type thin-film transistor in the prior art.
Figure 2:
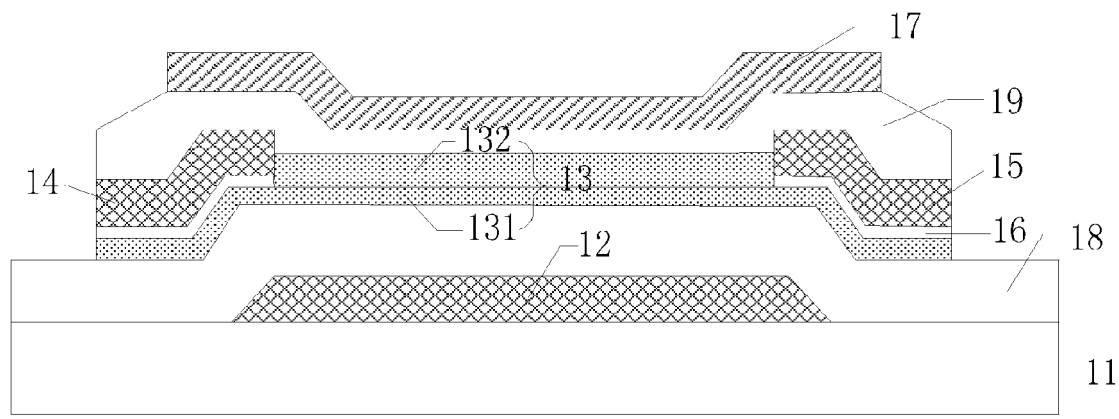
FIG. 2 is a schematic structural view of a thin-film transistor provided by an embodiment of the present invention.

An embodiment of the present invention provides a thin-film transistor, as shown in FIG. 2, which comprises a substrate 11, a gate electrode 12 disposed on the substrate 11, an active layer 13 disposed on the gate electrode 12 and insulated from the gate electrode 12, and a source electrode 14 and a drain electrode 15 which are oppositely arranged and electrically connected with the active layer 13 respectively. The active layer 13 comprises a first active layer 131 and a second active layer 132 which are stacked. An orthographic projection of the first active layer 131 on the substrate 11 covers orthographic projections of the source electrode 14, the drain electrode 15 as well as a gap located between the source electrode 14 and the drain electrode 15 on the substrate 11, and covers an orthographic projection of the gate electrode 12 on the substrate 11. The second active layer 132 is located at the gap between the source electrode 14 and the drain electrode 15, and an orthographic projection of the second active layer 132 on the substrate 11 is located in a region where the orthographic projection of the gate electrode 12 on the substrate 11 is located.

In the above thin-film transistor provided by the embodiment of the present invention, the active layer in the thin-film transistor comprises the first active layer and the second active layer which are stacked. The orthographic projection of the first active layer on the substrate covers the orthographic projections of the source electrode, the drain electrode, as well as the gap located between the source electrode and the drain electrode on the substrate, and covers the orthographic projection of the gate electrode on the substrate. The second active layer is located at the gap between the source electrode and the drain electrode, and the orthographic projection of the second active layer on the substrate is located in the region where the orthographic projection of the gate electrode on the substrate is located. Under a backlight illumination condition, because the region where the second active layer of the thin-film transistor is located is shielded by the gate electrode, only a region, which is not shielded by the gate electrode, in the first active layer may generate photo-induced carriers. Consequently, there are less photo-induced carriers generated by such a structure, the increase of an off-state current is effectively inhibited, and thus an on-state current to off-state current ratio is increased, leading to an improved luminescence property of the thin-film transistor, and an enhanced image display quality of a display device.

Further, in specific implementations, in the above thin-film transistor provided by the embodiment of the present invention, the second active layer 132 is located above the first active layer 131 and mutually connected with the first active layer 131, especially electrically connected with the first active layer 131. In this way, as viewed from outside, the first active layer 131 and the second active layer 132 still remain an integral body, so that the transmission of a current is facilitated. Furthermore, the first active layer 131 and the second active layer 132 may be mutually insulated, and electrically connected with the source electrode and the drain electrode individually, which will not be described in detail here. Exemplarily, the first active layer 131 and the second active layer 132 may be mutually insulated by means of an insulation layer IS, and electrically connected with the source electrode and the drain electrode through individual connection channels respectively.

In specific implementations, in the above thin-film transistor provided by the embodiment of the present invention, a thickness of the second active layer 132 is generally greater than that of the first active layer 131. In this way, under the backlight illumination condition, the first active layer 131 only absorbs less photons. Because the number of the photons absorbed by an amorphous silicon thin film directly determines the number of the photon-induced carriers generated in the film, the number of the generated photon-induced carriers is reduced. Consequently, the adverse effect of backlight illumination on the off-state current of the thin-film transistor can be effectively inhibited; i.e., the increase of the off-state current is effectively inhibited, and further the on-state current to off-state current ratio is increased.

In specific implementations, in the above thin-film transistor provided by the embodiment of the present invention, a thickness of the first active layer 131 is 60 nm-100 nm. In this way, a film thickness of the first active layer below the source electrode and the drain electrode under the backlight illumination is very small, so that less photons are absorbed under the backlight illumination condition, and an affect of the generated photon-induced carriers on the off-state current of the thin-film transistor is far smaller than that of a conventional thin-film transistor structure. It is assumed that an absorption coefficient $\alpha$ of an a-Si:H thin film is $1\times10^{-4}$ $cm^{-1}$, then the thickness of the first active layer 131 is 80 nm, whereas the total film thickness of the active layer in the conventional thin-film transistor structure is 300 nm. Calculations show that under the backlight illumination of same intensity, the number of the photon-induced carriers generated in the first active layer is only 30% of that in the conventional thin-film transistor structure. Consequently, the above thin-film transistor provided by the embodiment of the present invention may ensure a high on-state current to off-state current ratio, thereby improving the luminescence property of the thin-film transistor, and enhancing the image display quality of the display device.

In specific implementations, in the above thin-film transistor provided by the embodiment of the present invention, the sum of the thicknesses of the first active layer 131 and the second active layer 132 is 100 nm-500 nm. The sum of thicknesses of the two layers approaches the total thickness of the active layer in the conventional thin-film transistor structure, which may ensure that no adverse effect on an on-state current of the thin-film transistor is caused.

Generally, in some implementations, in order to improve contact characteristics between the source electrode 14 and the active layer 13 as well as between the drain electrode 15 and the active layer 13, particularly, as shown in FIG. 2, the above thin-film transistor provided by the embodiment of the present invention may further comprise ohmic contact layers 16 disposed between the first active layer 131 and the source electrode 14 as well as disposed between the first active layer 131 and the drain electrode 15.

In specific implementation, as shown in FIG. 2, because the electrical performance of the thin-film transistor is susceptible to light, in order to prevent external light from affecting the second active layer of the thin-film transistor and avoid the increase of the off-state current, the above thin-film transistor provided by the embodiment of the present invention further comprises a light-shielding layer 17 disposed above the second active layer 132 and mutually insulated from the second active layer 132; moreover, an orthographic projection of the light-shielding layer 17 on the substrate 11 covers the orthographic projection of the second active layer 132 on the substrate 11.

Particularly, as shown in FIG. 2, the above thin-film transistor provided by the embodiment of the present invention generally may further comprise a gate insulating layer 18 disposed between the gate electrode 12 and the active layer 13, and this gate insulating layer 18 may enable the gate electrode 12 to be mutually insulated from the active layer 13. Moreover, the thin-film transistor generally may further comprise a passivation layer 19 disposed over the source electrode 14 and the drain electrode 15, and this passivation layer 19 may enable the light-shielding layer 17 to be mutually insulated from the second active layer 132, which will not be described in detail here.

Based on the same inventive concept, an embodiment of the present invention further provides an array substrate, which comprises the above thin-film transistor provided by the embodiment of the present invention. Because a principle to solve the problem by the array substrate is similar to that by the above thin-film transistor. Implementations of the array substrate may refer to implementations of the thin-film transistor, and repeated parts will not be described in detail.

In specific implementations, the above array substrate provided by the embodiment of the present invention may be applied to a liquid-crystal display panel, and may also be applied to an organic light emitting diode display panel, which will not be defined here.

Based on the same inventive concept, an embodiment of the present invention further provides a display apparatus, which comprises the above array substrate provided by the embodiment of the present invention. The display apparatus may be a display, a mobile phone, a television, a notebook computer, an all-in-one machine and the like. Other necessary components of the display apparatus should all be understood by those of ordinarily skilled in the art, which will not be described in detail here and should not be construed as limiting the present invention.

Based on the same inventive concept, an embodiment of the present invention further provides a fabricating method of the above thin-film transistor provided by the embodiment of the present invention. Because a principle to solve the problem by the method is similar to that by the above thin-film transistor, implementations of the method may refer to implementations of the thin-film transistor, and repeated parts will not be described in detail.

Figure 3:
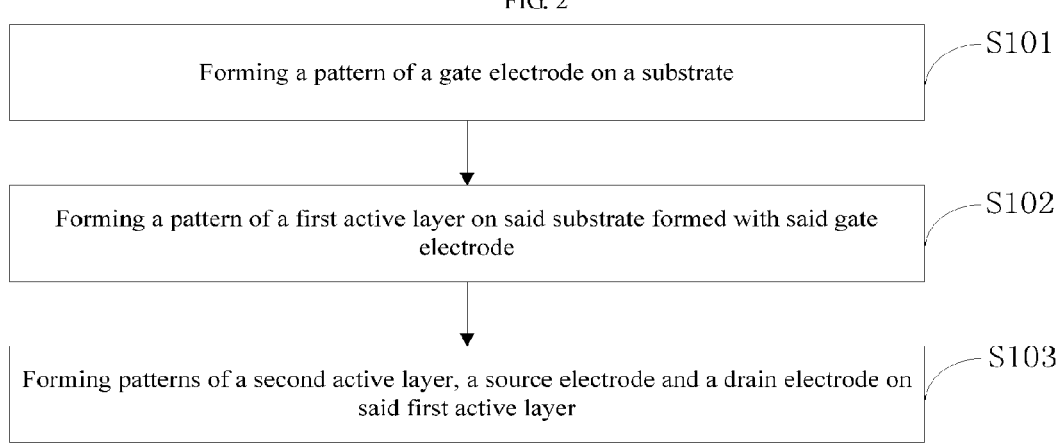
FIG. 3 is a flow chart of a fabricating method of a thin-film transistor provided by an embodiment of the present invention.

In specific implementations, as shown in FIG. 3, the fabricating method of the thin-film transistor provided by the embodiment of the present invention particularly comprises the following steps:

Step 101. Forming a pattern of a gate electrode on a substrate;

in specific implementation, depositing one layer of metal material on the substrate, and patterning the metal material so as to form the pattern of the gate electrode.

Step 102. Forming a pattern of a first active layer on the substrate formed with the gate electrode;

in specific implementation, depositing one layer of amorphous silicon material on the substrate formed with the gate electrode, and patterning the amorphous silicon material so as to form the pattern of the first active layer.

Step 103. Forming patterns of a second active layer, a source electrode and a drain electrode on the first active layer.

In specific implementations, forming patterns of a second active layer, a source electrode and a drain electrode on the first active layer may particularly employ the following manners:

In some implementations:

First, depositing one layer of amorphous silicon material on the first active layer, and patterning the amorphous silicon material to enable an orthographic projection of the amorphous silicon material on the substrate to be located in a region where an orthographic projection of the gate electrode on the substrate is located, so as to form the pattern of the second active layer.

Second, depositing one layer of metal material on the second active layer, and patterning the metal material to enable an orthographic projection of the metal material on the substrate to be located in a region, which does not include the orthographic projection of the gate electrode on the substrate, in an orthographic projection of the first active layer on the substrate, so as to form the patterns of the source electrode and the drain electrode which are connected with the second active layer.

In another implementation:

First, depositing one layer of metal material on the first active layer, and patterning the metal material to enable an orthographic projection of the metal material on the substrate to be located in a region, which does not include the orthographic projection of the gate electrode on the substrate, in an orthographic projection of the first active layer on the substrate, so as to form the patterns of the source electrode and the drain electrode.

Second, depositing one layer of amorphous silicon material on the source electrode and the drain electrode, and patterning the amorphous silicon material to enable an orthographic projection of the amorphous silicon material on the substrate is located in a region where the orthographic projection of the gate electrode on the substrate is located, so as to form the pattern of the second active layer which is connected with the source electrode and the drain electrode.

The following will describe the fabricating method of the thin-film transistor provided by the embodiment of the present invention in detail by way of one specific instance, and the fabricating method particularly comprises the following steps:

1. Depositing one layer of metal chromium film on a clean plate glass, and forming a pattern of a gate electrode by a photolithography process.

2. Sequentially depositing an a-SiNx thin film as a gate insulating layer, an a-Si:H thin film as a first active layer and an n+ type a-Si:H thin film as an ohmic contact layer on a continuous separation type multi-reactor plasma enhanced chemical vapor deposition (PECVD) device. In a preparation process, used raw gases comprise a silane ($SiH_4$) diluted in hydrogen, wherein the content of the $SiH_4$ is 10%, as well as phosphorane ($PH_3$) diluted in ammonia gas and hydrogen, wherein the content of the $PH_3$ is 20%;

Process parameters for preparing an amorphous silicon-based thin film are set forth in the following table 1.

3. After forming a layer of n+ type a-Si:H thin film by a photolithography process, depositing one layer of metal chromium film, and forming a source electrode and a drain electrode by a photolithography process.

4. After etching the n+ type a-Si:H thin film between the source electrode and the drain electrode, depositing a second layer of a-Si:H thin film of a certain thickness with the process parameters for growing the a-Si:H thin film in Table 1 by a PECVD process, and forming a second active layer by a photolithography process. It should be especially noted that, when the n+ type a-Si:H thin film is etched by plasma and the second layer of a-Si:H thin film is deposited, a certain process measure should be taken to eliminate an interface state therebetween.

5. To eliminate the affect of front illumination on the performance of the TFT, preparing an a-SiNx thin film as a passivation layer on the second active layer. Then, depositing a metal chromium film on the passivation layer, and forming a light-shielding layer by a photolithography process. In a preparation process, the amorphous silicon-based thin film is etched by a plasma etching technology adopting a tetrafluoromethane ($CF_4$) gas, and selective etching of the a-Si:H and a-SiNx thin film is obtained through controlling a substrate temperature, a reactor gas pressure and a radio-frequency power. Wherein, a ratio W:L of width W to length L of a conducting channel of the amorphous silicon thin-film transistor is equal to 100:10, in this way, a higher on-state current may be ensured.

At this point, the above thin-film transistor provided by the embodiment of the present invention is fabricated by the above steps 1-5 provided by the instance.

The embodiments of the present invention provide a thin-film transistor and a fabricating method thereof, an array substrate and a display apparatus. The active layer in the thin-film transistor comprises the first active layer and the second active layer, which are stacked. The orthographic projection of the first active layer on the substrate covers the orthographic projections of the source electrode, the drain electrode as well as the gap located between the source electrode and the drain electrode on the substrate, and covers the orthographic projection of the gate electrode on the substrate. The second active layer is located at the gap between the source electrode and the drain electrode, and the orthographic projection of the second active layer on the substrate is located in a region where the orthographic projection of the gate electrode on the substrate is located. Under the backlight illumination condition, because the region where the second active layer of the thin-film transistor is located is shielded by the gate electrode, only a region, which is not shielded by the gate electrode, in the first active layer may generate the photo-induced carriers. Consequently, there are less photo-induced carriers generated by such a structure, the increase of the off-state current is effectively inhibited, and thus the on-state current to off-state current ratio is increased, leading to an improved luminescence property of the thin-film transistor, and an enhanced image display quality of the display device.

TABLE 1

| Thin Film | Background Vacuum level/Pa | $SiH_4$ Flow Velocity/sccm | $NH_3$ Flow Velocity/sccm | $PH_3$ Flow Velocity/sccm | Reaction Pressure/Pa | Radio-Frequency Power/W | Substrate Temperature/° C. |
|---|---|---|---|---|---|---|---|
| a-SiNx | $\leq 4 \times 10^{-3}$ | 5-10 | 5-60 | | 50-100 | 60-120 | 200-300 |
| a-Si:H | $\leq 4 \times 10^{-3}$ | 20-60 | | | 100-200 | 60-120 | 200-300 |
| n+ type a-Si:H | $\leq 4 \times 10^{-3}$ | 10-30 | | 30-60 | 100-200 | 100-200 | 200-300 |

It will be apparent to those skilled in the art that various modifications and variations can be made to the present invention without departing from the scope or spirit of the present invention. In this way, it is intended that the present invention covers these modifications and variations provided they come within the scope of the appended claims and their equivalents of the present invention.

What is claimed is:

1. A thin-film transistor, comprising a substrate, a gate electrode disposed on said substrate, an active layer disposed on said gate electrode and insulated from said gate electrode, as well as a source electrode and a drain electrode which are oppositely arranged,
   wherein said active layer comprises a first active layer and a second active layer which are stacked, said first active layer being electrically connected with said source electrode and said drain electrode, while said second active layer also being electrically connected with said source electrode and said drain electrode;
   wherein an orthographic projection of said first active layer on said substrate covers orthographic projections of said source electrode, said drain electrode as well as a gap located between said source electrode and said drain electrode on said substrate, and covers an orthographic projection of said gate electrode on said substrate; and
   wherein said second active layer is located at said gap between said source electrode and said drain electrode, and an orthographic projection of said second active layer on said substrate is located in a region where the orthographic projection of said gate electrode on said substrate is located.

2. The thin-film transistor according to claim 1, wherein said second active layer is located above said first active layer and mutually connected with said first active layer.

3. The thin-film transistor according to claim 2, wherein said second active layer is electrically connected with said first active layer.

4. The thin-film transistor according to claim 2, wherein said second active layer is mutually insulated from said first active layer, and electrically connected with said source electrode and said drain electrode individually.

5. The thin-film transistor according to claim 1, further comprising ohmic contact layers which are disposed between said first active layer and said source electrode as well as between said first active layer and said drain electrode.

6. The thin-film transistor according to claim 1, further comprising a light-shielding layer disposed above said second active layer and mutually insulated from said second active layer;
   an orthographic projection of said light-shielding layer on said substrate covers the orthographic projection of said second active layer on said substrate.

7. The thin-film transistor according to claim 1, wherein a thickness of said second active layer is greater than that of said first active layer.

8. The thin-film transistor according to claim 7, wherein a thickness of said first active layer is 60 nm-100 nm.

9. The thin-film transistor according to claim 8, wherein the sum of thicknesses of said first active layer and said second active layer is 100 nm-500 nm.

10. An array substrate, comprising the thin-film transistor according to claim 1.

11. A display apparatus, comprising the array substrate according to claim 10.

12. A fabricating method of the thin-film transistor according to claim 1, comprising:
   forming a pattern of a gate electrode on a substrate;
   forming a pattern of a first active layer on said substrate formed with said gate electrode; and
   forming patterns of a second active layer, a source electrode and a drain electrode on said first active layer.

* * * * *